(12) United States Patent
Jian et al.

(10) Patent No.: US 10,561,026 B2
(45) Date of Patent: Feb. 11, 2020

(54) METHOD FOR MANUFACTURING A HIGH-CURRENT PRINTED CIRCUIT BOARD

(71) Applicants: Avary Holding (Shenzhen) Co., Limited., Shenzhen (CN); HongQiSheng Precision Electronics (QinHuangDao) Co., Ltd., Qinhuangdao (CN)

(72) Inventors: Rih-Sin Jian, New Taipei (TW); Xiao-Wei Kang, Shenzhen (CN); Li Yang, Shenzhen (CN)

(73) Assignees: Avary Holding (Shenzhen) Co., Limited., Shenzhen (CN); HongQiSheng Precision Electronics (QinHuangDao) Co., Ltd., Qinhuangdao (CN)

( * ) Notice: Subject to any disclaimer, the term of this patent is extended or adjusted under 35 U.S.C. 154(b) by 0 days.

(21) Appl. No.: 16/430,766

(22) Filed: Jun. 4, 2019

(65) Prior Publication Data

US 2019/0289726 A1  Sep. 19, 2019

Related U.S. Application Data

(62) Division of application No. 15/835,817, filed on Dec. 8, 2017, now Pat. No. 10,492,309.

(30) Foreign Application Priority Data

Aug. 24, 2017  (CN) .......................... 2017 1 0735480

(51) Int. Cl.
  *H05K 3/42* (2006.01)
  *H05K 3/46* (2006.01)
  (Continued)

(52) U.S. Cl.
  CPC .......... *H05K 3/4685* (2013.01); *G11B 5/484* (2013.01); *G11B 5/486* (2013.01); *H05K 1/0265* (2013.01);
  (Continued)

(58) Field of Classification Search
  CPC .......... H05K 1/14; H05K 1/141; H05K 1/144; H05K 1/0265; H05K 1/0298; H05K 1/056;
  (Continued)

(56) References Cited

U.S. PATENT DOCUMENTS 3,499,218 A * 3/1970 Tally ........................ H05K 3/28
                                                    156/250
4,450,029 A * 5/1984 Holbert .................. H02G 5/005
                                                    156/250
4,685,033 A * 8/1987 Inoue .................. H01L 23/5383
                                                    174/258

* cited by examiner

*Primary Examiner* — Carl J Arbes
(74) *Attorney, Agent, or Firm* — ScienBiziP, P.C.

(57) ABSTRACT

A method for manufacturing a high-current printed circuit board, comprising: providing a circuit substrate comprising a substrate layer; a first circuit layer formed on the substrate layer; and a second circuit layer formed on the substrate layer and facing away from the first circuit layer, wherein first conductive circuits are defined on the first circuit layer, second conductive circuits are defined on the second circuit layer, and a line width of each of the first conductive circuits is greater than a line width of each of the second conductive circuits; and forming buffering circuits by plating, wherein the buffering circuits are electrically connected the first circuit layer to the second circuit layer; wherein a line width of each of the buffering circuits is greater than the line width of each of the second conductive circuits.

12 Claims, 6 Drawing Sheets

(51) Int. Cl.
*G11B 5/48* (2006.01)
*H05K 1/05* (2006.01)
*H05K 1/02* (2006.01)
*H05K 1/14* (2006.01)
*H05K 1/11* (2006.01)

(52) U.S. Cl.
CPC .......... H05K 1/0298 (2013.01); H05K 1/056 (2013.01); H05K 1/112 (2013.01); H05K 1/115 (2013.01); H05K 1/144 (2013.01); H05K 3/427 (2013.01); *H05K 1/0245* (2013.01); *H05K 3/4611* (2013.01); *H05K 2201/0183* (2013.01); *H05K 2201/09563* (2013.01); *H05K 2201/09727* (2013.01); *H05K 2201/09881* (2013.01); *H05K 2203/0323* (2013.01)

(58) Field of Classification Search
CPC ........ H05K 1/112; H05K 1/115; H05K 3/427; H05K 3/4685; G11B 5/484; G11B 5/486
See application file for complete search history.

METHOD FOR MANUFACTURING A HIGH-CURRENT PRINTED CIRCUIT BOARD

CROSS-REFERENCE TO RELATED APPLICATIONS

This is a divisional application of patent application Ser. No. 15/835,817, filed on Dec. 8, 2017, entitled "PRINTED CIRCUIT BOARD AND METHOD FOR MANUFACTURING THE SAME", assigned to the same assignee, which is based on and claims priority to China Patent Application No. 201710735480.X filed on Aug. 24, 2017, the contents of which are incorporated by reference herein.

FIELD

The subject matter generally relates to a printed circuit board and method for manufacturing the printed circuit board.

BACKGROUND

A circuit board in a vehicle headlight comprises a vehicle-mounted battery module and a light-emitting diode. The vehicle-mounted battery module provides a driving current to the light-emitting diode to control the light-emitting diode to emit light. The rated power of the light-emitting diode is small, according to $P=U^2*S/(\rho L)$ (where P represents power, U represents voltage, $\rho$ represents conductor resistivity, and L represents resistance), and when U, $\rho$, L are invariant, S is smaller. The circuit connecting the vehicle-mounted battery module and the light-emitting diode carries fine-scale lines. When a high power current runs through the fine-scale lines a large amount of heat is produced, and such heat will damage the light-emitting diode.

BRIEF DESCRIPTION OF THE DRAWINGS

Implementations of the present disclosure will now be described, by way of example only, with reference to the attached figures.

DETAILED DESCRIPTION OF EMBODIMENTS

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to illustrate details and features of the present disclosure better.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one".

The term "comprising" when utilized, means "including, but not necessarily limited to"; it specifically indicates open-ended inclusion or membership in the so-described combination, group, series, and the like.

Figure 1A:
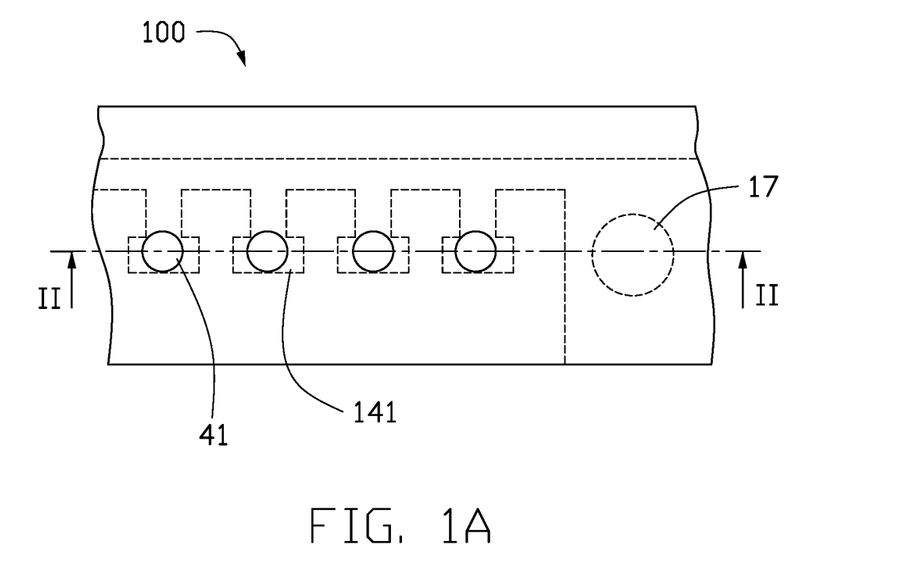
FIG. 1A is a plan view of an exemplary embodiment of a high-current printed circuit board of the present disclosure.
Figure 1B:
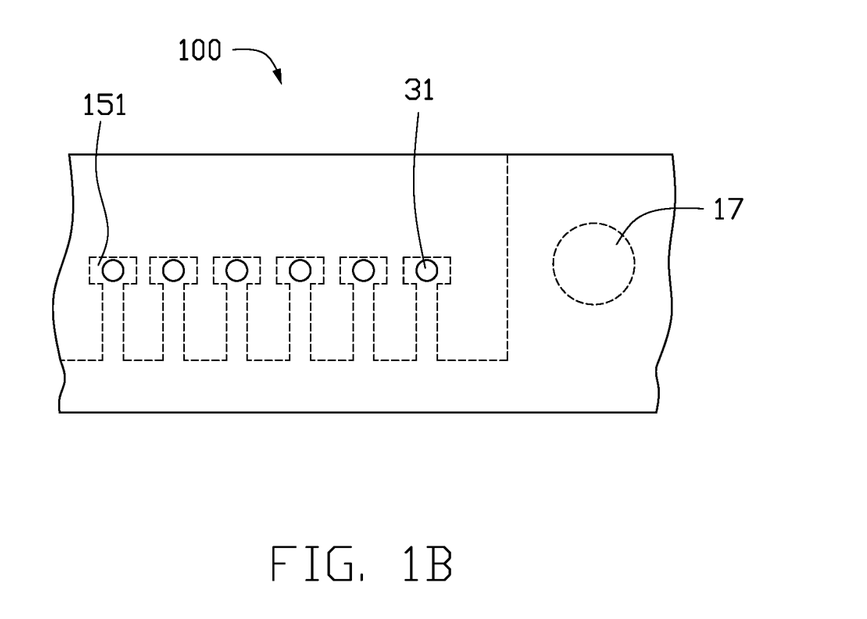
FIG. 1B is another plan view of the high-current printed circuit board of FIG. 1.
Figure 2:
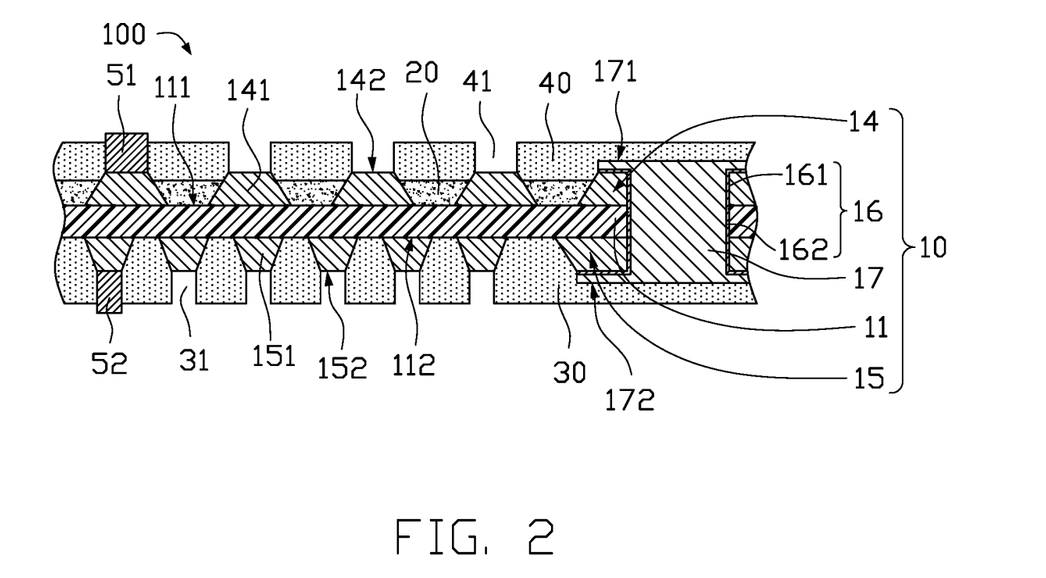
FIG. 2 is a cross-sectional view of the high-current printed circuit board of FIG. 1A.

FIGS. 1A, 1B, and 2 illustrate an exemplary embodiment of a high-current printed circuit board 100. The high-current printed circuit board 100 includes a circuit substrate 10, a plurality of buffering circuits 17, a dielectric layer 20, a first cover layer 40, and a second cover layer 30.

The circuit substrate 10 includes a substrate layer 11, a first circuit layer 14, and a second circuit layer 15.

The substrate layer 11 can be made of one or more of insulating materials selected from polyimide (PI), polyethylene terephthalate (PET), polyethylene naphthalate (PEN), polyethylene (PE), teflon, liquid crystal polymer (LCP), and polyvinyl chloride polymer (PVC).

In at least one exemplary embodiment, the substrate layer 11 is made of PI.

The substrate layer 11 includes a first surface 111 and a second surface 112 facing away from the first surface 111. The first circuit layer 14 is formed on the first surface 111. The second circuit layer 15 is formed on the second surface 112.

The first circuit layer 14 includes a plurality of first conductive circuits 141. The second circuit layer 15 includes a plurality of second conductive circuits 151.

A line width of each of the first conductive circuits 141 is greater than a line width of each of the second conductive circuits 151. That is, the first conductive circuits 141 have greater line width compared with the second conductive circuits 151.

In at least one exemplary embodiment, the line width of each of the first conductive circuits 141 is at least three times greater than the line width of each of the second conductive circuits 151.

The circuit substrate 10 also includes a plurality of via holes 16. The via holes 16 pass through the first circuit layer 14, the substrate 11, and the second circuit layer 15. The via holes 16 are electrically connected to the first circuit layer 14 and the second circuit layer 15.

The buffering circuits 17 are formed in the via holes 16, and electrically connect the first circuit layer 14 to the second circuit layer 15.

The buffering circuits 17 deliver current from the first conductive circuits 141 to the second conductive circuits 151.

The total number of buffering circuits 17 is less than the total number of via holes 16.

The buffering circuits 17 include a third surface 171 and a fourth surface 172 facing away from the third surface 171. The third surface 171 protrudes from the first circuit layer 14. The fourth surface 172 protrudes from the second circuit layer 15.

In at least one exemplary embodiment, the buffering circuits 17 cover a portion of the first circuit layer 14 and a portion of the second circuit layer 15.

A line width of each buffering circuit 17 is greater than the line width of each second conductive circuit 151. That is, the buffering circuits 17 have greater line width compared with those of the second conductive circuits 151.

The dielectric layer 20 fills in gaps of the first conductive circuits 141.

A thickness of the dielectric layer 20 is less than a thickness of each first conductive circuit 141.

In at least one exemplary embodiment, the dielectric layer 20 is made of adhesive.

Flowability of the dielectric layer 20 is greater than the flowability of adhesive of a common cover film.

The first cover layer 40 covers the first circuit layer 14 and the dielectric layer 20.

The first cover layer 40 includes a plurality of first openings 41. Some of the first conductive circuits 141 are exposed from the first openings 41 to form a plurality of connecting terminals 142. The connecting terminals 142 are electrically connected to first electronic components 51.

In at least one exemplary embodiment, the first electronic components 51 are vehicle-mounted battery modules.

Since the line width of each first conductive line 141 is larger than the line width of each second conductive line 151, the gaps of the first conductive circuits 141 are wider than the gaps of the second conductive circuits 151. Thus, the first cover layer 40 may not completely fill in the gaps of the first conductive circuits 141 when the first cover layer 40 covers the first circuit layers 14. However, the dielectric layer 20 and the first cover layer 40 cooperatively and completely fill in the gaps of the first conductive circuits 141.

The second cover layer 30 covers the second circuit layer 15.

The second cover layer 30 includes a plurality of second openings 31. Some of the second conductive circuits 151 are exposed from the second openings 31 to form a plurality of electrical contact pads 152. The electrical contact pads 152 are electrically connected to second electronic components 52.

The power consumption or throughput of current of the first electronic components 51 is greater than that of the second electronic components 52.

In at least one exemplary embodiment, the second electronic components 52 are light emitting diodes.

The first electronic components 51 provide electrical power to the second electronic components 52 and drive the second electronic components 52 to work.

Figure 3:
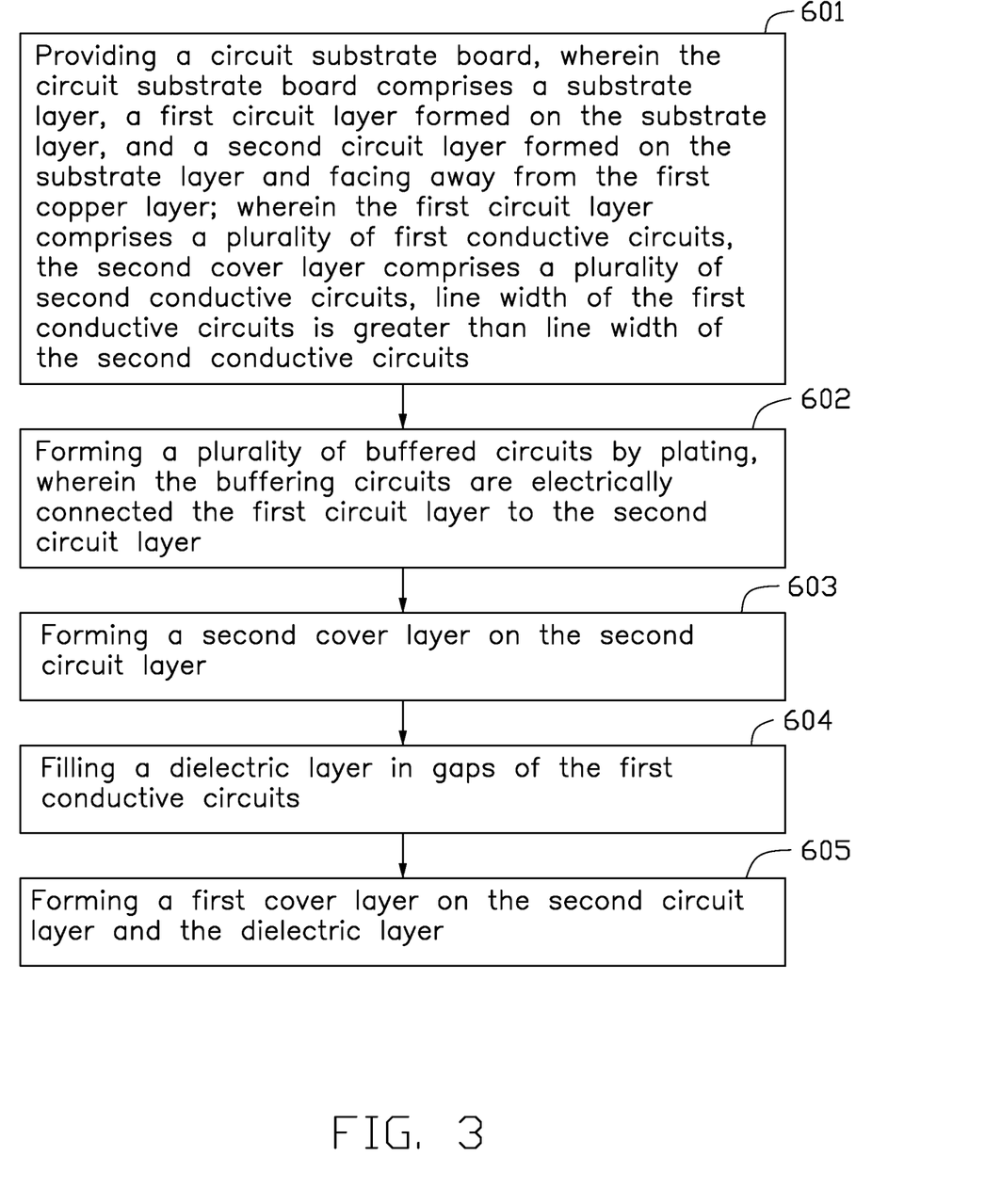
FIG. 3 is a flowchart of an exemplary embodiment of a method for manufacturing the high-current printed circuit board of FIG. 2.

FIG. 3 illustrates a flowchart of a method for manufacturing a high-current printed circuit board 100. The method is provided by way of example, as there are a variety of ways to carry out the method. The method described below can be carried out using the configurations illustrated in FIG. 1, for example, and various elements of these figures are referenced in explaining example method. Each block shown in FIG. 2 represents one or more processes, methods, or subroutines, carried out in the exemplary method. Furthermore, the illustrated order of blocks is by example only and the order of the blocks can change. Additional blocks may be added or fewer blocks may be utilized, without departing from this disclosure. The exemplary method can begin at block 601.

Figure 4:
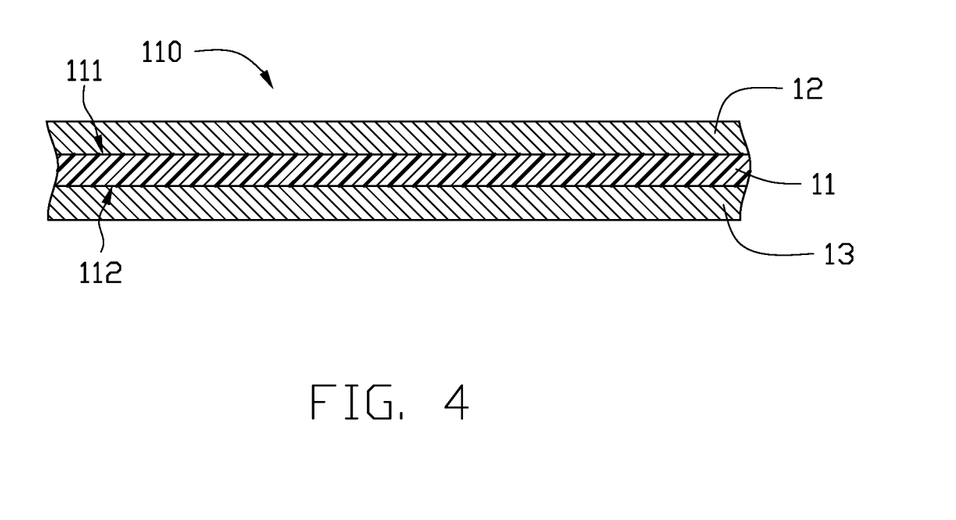
FIG. 4 is a cross-sectional view of a copper clad laminate used in the method of FIG. 3.
Figure 5:
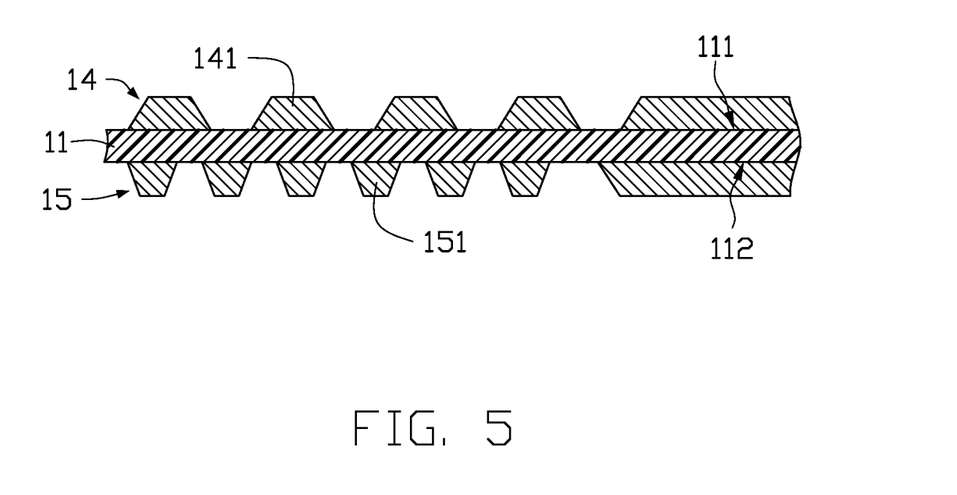
FIG. 5 is a cross-sectional view showing the copper clad laminate of FIG. 4 etched to form a first circuit layer and a second circuit layer.
Figure 6:
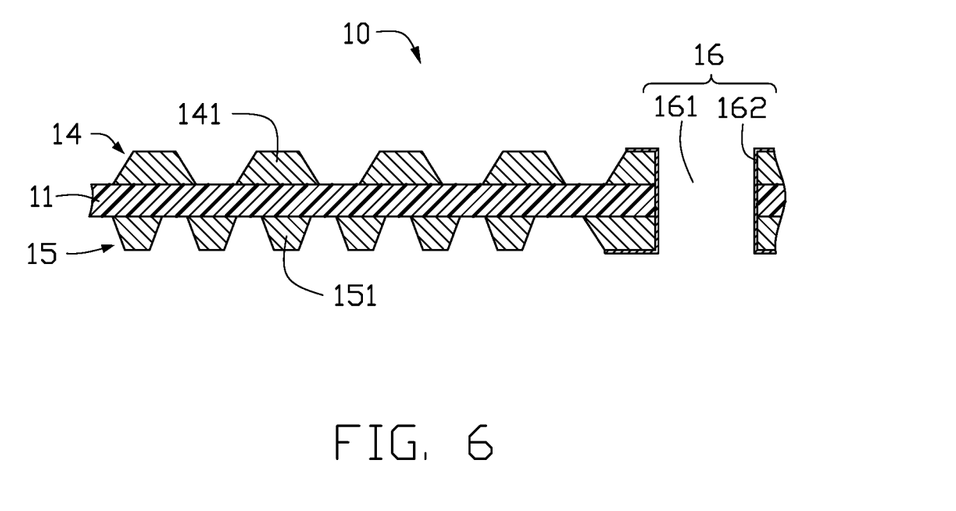
FIG. 6 is a cross-sectional view of via holes formed in the copper clad laminate of FIG. 5.

At block 601, as illustrated by FIGS. 4-6, a circuit substrate 10 is provided. The circuit substrate 10 includes a substrate layer 11, a first circuit layer 14, a second circuit layer 15, and a plurality of via holes 16.

The substrate layer 11 can be made of one or more of insulating materials selected from polyimide (PI), polyethylene terephthalate (PET), polyethylene naphthalate (PEN), polyethylene (PE), teflon, liquid crystal polymer (LCP), and polyvinyl chloride polymer (PVC).

In at least one exemplary embodiment, the substrate layer 11 is made of PI.

The substrate layer 11 includes a first surface 111 and a second surface 112 facing away from the first surface 111. The first circuit layer 14 is formed on the first surface 111. The second circuit layer 15 is formed on the second surface 112.

The first circuit layer 14 and the second circuit layer 15 are both formed by a process of image transfer and etching.

The first circuit layer 14 includes a plurality of first conductive circuits 141. The second circuit layer 15 includes a plurality of second conductive circuits 151.

A line width of each first conductive circuit 141 is greater than a line width of each second conductive circuit 151. That is, the first conductive circuits 141 have greater line width compared with those of the second conductive circuits 151.

In at least one exemplary embodiment, the line width of the first conductive circuits 141 is at least three times greater than the line width of the second conductive circuits 151.

The via holes 16 pass through the first circuit layer 14, the substrate 11, and the second circuit layer 15.

The via holes 16 electrically connect the first circuit layer 14 and the second circuit layer 15. Diameter of each through hole 16 is greater than the line width of each second conductive circuit 151.

In at least one exemplary embodiment, the circuit substrate 10 can be manufactured by following steps:

First, as illustrated by FIG. 4, a copper clad laminate 110 is provided. The copper clad laminate 110 includes a substrate layer 11, a first copper layer 12, and a second copper layer 13. The substrate layer 11 includes a first surface 111 and a second surface 112 facing away from the first surface 111. The first copper layer 12 is formed on the first surface 111. The second copper layer 13 is formed on the second surface 112. In at least one exemplary embodiment, a thicknesses of the first copper layer 12 and the second copper layer 13 are both 36 um.

Second, also as illustrated by FIG. 5, the first circuit layer 14 is formed on the first surface 111 by etching the first copper layer 12, and the second circuit layer 15 is formed on the second surface 112 by etching the second copper layer 13.

Third, also as illustrated by FIG. 6, via holes 16 are formed which pass through the first circuit layer 14, the substrate layer 11, and the second circuit layer 15, thereby forming the circuit substrate 10.

The via holes 16 can be formed by the following steps. A plurality of through holes 161 can be defined by mechanical punching or laser etching. Electrically conductive material 162 is infilled into the through holes 161 by a plating or sputtering process to form the via holes 16.

Figure 7:
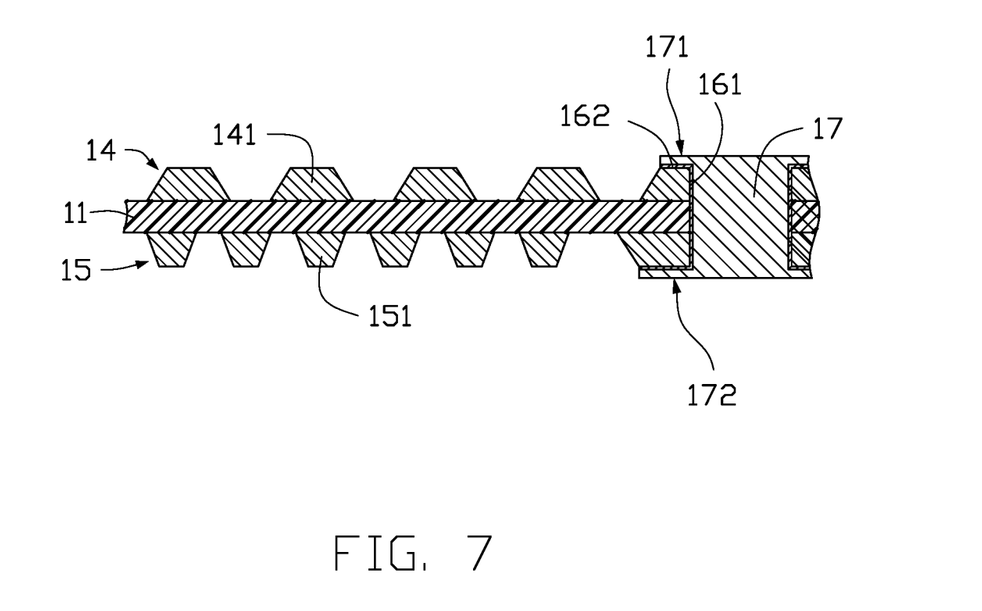
FIG. 7 is a cross-sectional view of a buffering circuit formed in the via holes of FIG. 6.

At block 602, also as illustrated by FIG. 7, a plurality of buffering circuits 17 is formed in one or more of the via holes 16 by a plating process.

The buffering circuits 17 are formed in at least one via hole 16.

The buffering circuits 17 deliver current including high current from the first conductive circuits 141 to the second conductive circuits 151.

The total number of buffering circuits 17 is less than the total number of via holes 16 in the circuit substrate 10.

The buffering circuits 17 electrically connect the first circuit layer 14 to the second circuit layer 15.

The buffering circuits 17 include a third surface 171 and a fourth surface 172 facing away from the third surface 171. The third surface 171 protrudes from the first circuit layer 14. The fourth surface 172 protrudes from the second circuit layer 15.

In at least one exemplary embodiment, the buffering circuits 17 cover a portion of the first circuit layer 14 and a portion of the second circuit layer 15.

A line width of each buffering circuit 17 is greater than the line width of each second conductive circuit 151. That is, the buffering circuits 17 have greater line width compared with those of the second conductive circuits 151.

Figure 8:
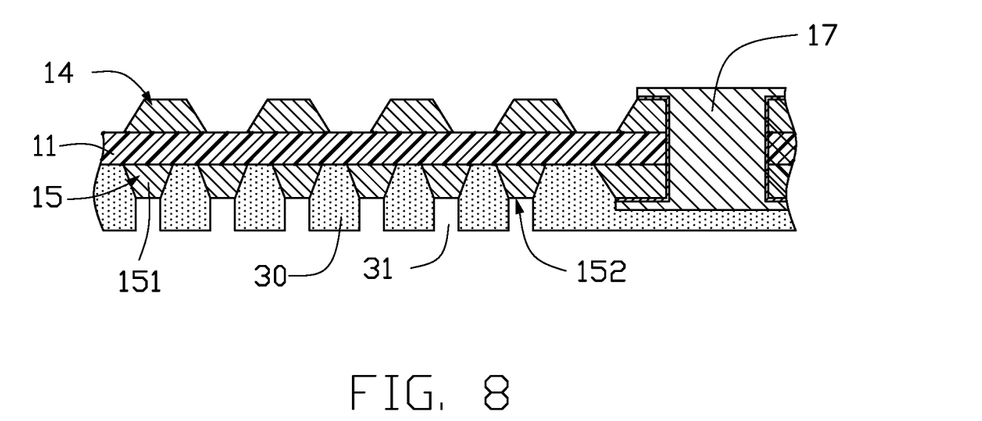
FIG. 8 is a cross-sectional view of a second cover layer formed on the second circuit layer of FIG. 5.

At block 603, also as illustrated by FIG. 8, a second cover layer 30 is formed on the second circuit layer 15.

The second cover layer 30 includes a plurality of second openings 31. Some of the second conductive circuits 151 are exposed from the second openings 31 to form electrical contact pads 152.

Figure 9:
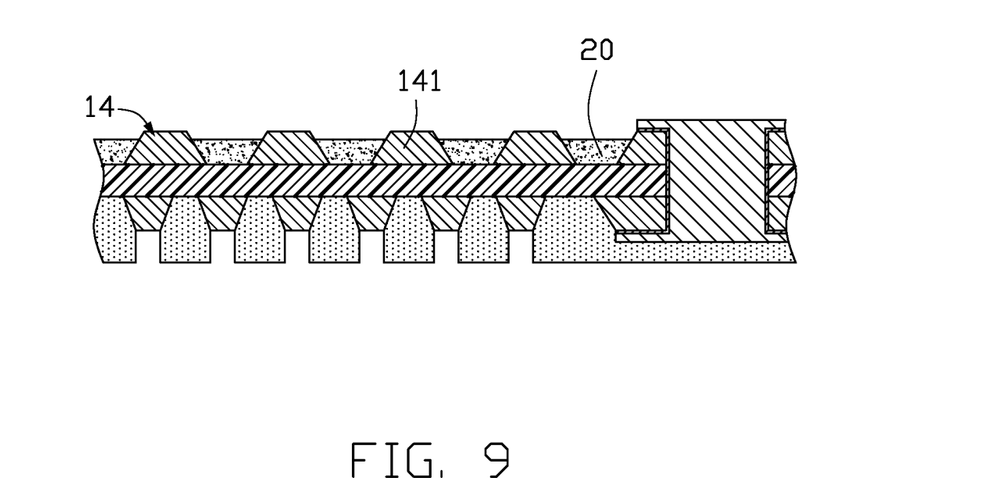
FIG. 9 is a cross-sectional view of a dielectric layer formed in gaps of the first circuit layer of FIG. 5.

At block 604, also as illustrated by FIG. 9, a dielectric layer 20 infills gaps of the first conductive circuits 141.

A thickness of the dielectric layer 20 is less than a thickness of each first conductive circuit 141.

In at least one exemplary embodiment, the dielectric layer 20 is made of adhesive.

Flowability of the dielectric layer 20 is greater than the flowability of adhesive of a common cover film.

At block 605, also as illustrated by FIG. 2, a first cover layer 40 is formed on the first circuit layer 14 and the dielectric layer 20, and at least one first electronic component 51 and at least one second electronic component 52 are provided. The first electronic component 51 is connected electrically to the first conductive lines 141, and the second electronic component 52 is connected electrically to the second conductive lines 151.

The first cover layer 40 includes a plurality of first openings 41. Some of the first conductive circuits 141 are exposed from the first openings 41 to form connecting terminals 142. The connecting terminals 142 are electrically connected to the first electronic components 51. The power consumption or throughput of current of the first electronic components 51 is greater than that of the second electronic components 52.

In at least one exemplary embodiment, the first electronic components 51 are vehicle-mounted battery modules.

In at least one exemplary embodiment, the second electronic components 52 are light emitting diodes.

Since the line width of each first conductive line 141 is larger than the line width of each second conductive line 151, the gaps of the first conductive circuits 141 are wider than the gaps of the second conductive circuits 151. Thus, the first cover layer 40 may not completely infill the gaps of the first conductive circuits 141 when the first cover layer 40 covers the first circuit layers 14. However, the dielectric layer 20 and the first cover layer 40 cooperatively and completely infill the gaps of the first conductive circuits 141.

With the above configuration, the buffering circuits 17 are electrically connected to the first conductive circuits 141 and the second conductive circuits 151. The line widths of the buffering circuits 17 are greater than the line widths of the second conductive circuits 151. Thus, when an electrical current from first electronic components 51 runs through the first conductive circuits 141 and the buffering circuits 17, and a loss will be produced in the first conductive circuits 141 and the buffering circuits 17 to make the electrical current from the first circuit layer and the buffering circuits to the second conductive circuits become a smaller current. Thus, the second conductive circuits 151 and second electronic components 52, having delicate and fine conductive lines, are never subjected to a high electrical current.

The embodiments shown and described above are only examples. Many details are often found in the art such as the other features of the printed circuit board. Therefore, many such details are neither shown nor described. Even though numerous characteristics and advantages of the present disclosure have been positioned forth in the foregoing description, together with details of the structure and function of the present disclosure, the disclosure is illustrative only, and changes can be made in the detail, including in matters of shape, size, and arrangement of the parts within the principles of the present disclosure, up to and including the full extent established by the broad general meaning of the terms used in the claims. It will therefore be appreciated that the embodiments described above can be modified within the scope of the claims.

What is claimed is:

1. A method for manufacturing a high-current printed circuit board, comprising:

providing a circuit substrate comprising a substrate layer; a first circuit layer formed on the substrate layer; and a second circuit layer formed on the substrate layer and facing away from the first circuit layer, wherein first conductive circuits are defined on the first circuit layer, second conductive circuits are defined on the second circuit layer, and a line width of each of the first conductive circuits is greater than a line width of each of the second conductive circuits;

forming via holes in the circuit substrate, wherein the via holes pass through the first circuit layer, the substrate layer, and the second circuit layer; and forming buffering circuits by infilling electrically conductive material into the via holes, wherein the buffering circuits are electrically connected the first circuit layer to the second circuit layer;

wherein a line width of each of the buffering circuits is greater than the line width of each of the second conductive circuits, thereby an electrical current from first conductive circuits and the buffering circuits to the second conductive circuits becomes a smaller current.

2. The method of claim 1, providing the circuit substrate further comprises forming via holes passing through each of the first circuit layer, the substrate, and the second circuit layer, wherein each of the via holes electrically connects the first circuit layer to the second circuit layer.

3. The method of claim 2, wherein the buffering circuits are defined in the via holes.

4. The method of claim 1, wherein the buffering circuits cover a portion of the first circuit layer and a portion of the second circuit layer.

5. The method of claim 1, further comprising:

forming a second cover layer on the second circuit layer;
defining second opening on the second cover layer;
forming electrical contact pads by exposing a portion of the second conductive circuits from the second openings, wherein the electrical contact pads are configured to be electrically connected to second electronic components.

6. The method of claim 5, further comprising:
filling a dielectric layer in gaps of the plurality of first conductive circuits.

7. The method of claim 6, wherein a thickness of the dielectric layer is less than a thickness of each of the plurality of first conductive circuits.

8. The method of claim 6, wherein the dielectric layer is made of adhesive.

9. The method of claim 6, wherein flow-ability of the dielectric layer is greater than flow-ability of adhesive of a common cover film.

10. The method of claim 6, further comprising:
forming a first cover layer on the second circuit layer and the dielectric layer; defining first opening on the first cover layer; forming connecting terminals by exposing a portion of the first conductive circuits from the first openings.

11. The method of claim 10, further comprising:
providing first electronic components and second electronic components and electrically connecting the first electronic components to the first conductive circuits and electrically connecting the second electronic components to the second conductive circuits; wherein the power consumption or throughput of current of the first electronic components is greater than that of the second electronic components.

12. The method of claim 1, wherein the line width of each of the first conductive circuits is at least three times greater than the line width of each of the second conductive circuits.

* * * * *